United States Patent [19]
Jones

[11] Patent Number: 5,764,007
[45] Date of Patent: Jun. 9, 1998

[54] MICRO-PROCESSOR BASED MOTOR CONTROL INTEGRATED CIRCUIT INCLUDING A BOOST REGULATED DC-TO-DC CONVERTER

[75] Inventor: Steven C. Jones, Garland, Tex.

[73] Assignee: Texas Instruments Incorporated, Dallas, Tex.

[21] Appl. No.: 425,853

[22] Filed: Apr. 20, 1995

[51] Int. Cl.$^6$ ........................................... H02P 1/54
[52] U.S. Cl. ................ 318/109; 318/442; 318/254; 318/138; 318/439; 318/106; 307/75
[58] Field of Search ........................ 318/109, 254, 318/138, 439, 106, 442, 798–815; 307/75; 363/13, 15; 323/259, 260

[56] References Cited

U.S. PATENT DOCUMENTS

| | | | |
|---|---|---|---|
| 4,612,417 | 9/1986 | Toumani | 323/259 X |
| 4,801,859 | 1/1989 | Dishner | 323/259 X |
| 4,823,070 | 4/1989 | Nelson | 323/259 X |
| 4,926,104 | 5/1990 | King et al. | 318/254 X |
| 5,210,474 | 5/1993 | Oswald | 318/254 |
| 5,247,161 | 9/1993 | Actis et al. | 323/259 X |
| 5,258,696 | 11/1993 | Le | 318/254 |
| 5,321,600 | 6/1994 | Fierheller | 363/15 X |
| 5,371,444 | 12/1994 | Griffin | 323/259 X |
| 5,372,410 | 12/1994 | Miller et al. | 363/14 X |
| 5,433,283 | 7/1995 | Shultz et al. | 318/254 X |
| 5,450,306 | 9/1995 | Garces et al. | 318/811 X |
| 5,461,301 | 10/1995 | Truong | 363/15 X |
| 5,463,603 | 10/1995 | Petersen | 323/259 X |
| 5,465,011 | 11/1995 | Miller et al. | 307/65 X |
| 5,581,171 | 12/1996 | Kerfoot et al. | 323/259 X |

*Primary Examiner*—Karen Masih
*Attorney, Agent, or Firm*—Bret J. Petersen; W. James Brady, III; Richard L. Donaldson

[57] ABSTRACT

A single chip integrated circuit includes a boost regulated DC-to-DC converter and gate drive circuits integrated on the same die with a micro-processor, along with high density digital logic functions, analog functions, etc. The gate drive circuits are used to drive external power FETs, particularly high side NMOS. The micro-processor may also be some type of micro-controller or digital signal processor. By being able to place these functions on a single integrated circuit, a motor or actuator control system can be placed on a single chip. With appropriate sensors to provide feedback to the integrated circuit, a system which is capable of executing actuator move functions, such as position, velocity, velocity profile, torque, etc., and sequencing these events as well is included.

10 Claims, 2 Drawing Sheets

MICRO-PROCESSOR BASED MOTOR CONTROL INTEGRATED CIRCUIT INCLUDING A BOOST REGULATED DC-TO-DC CONVERTER

BACKGROUND OF THE INVENTION

1. Field of the Invention

The present invention pertains to micro-processor based motor control integrated circuit and more particularly to an integrated circuit having a micro-processor for motor control and a boost regulated DC-to-DC converter for providing two different voltages from one DC source.

2. Related Prior Art

Motor control with a micro-processor is typically done with two separate integrated circuits, one for the processor and one for the interface to NMOS power Field Effect Transistors driving the motor. In this type of system, driving external NMOS power FETs, (Field Effect Transistors), a voltage source is required from which to drive gates of the high side FETS, which is higher in potential than voltage applied to the FET drains. In a single supply voltage system, such as a battery in an automotive application, this gate drive voltage source must somehow be generated with a DC-to-DC converter.

Prior art has produced no micro-processor based motor control integrated circuit that includes a boost regulated DC-to-DC converter. Two other methods of generating high side gate drive voltage are known, a charge pump method and a bootstrap capacitor method. Neither method actually regulates gate drive voltage with respect to the drain of the high side FETs. Having these functions together in a single integrated circuit reduces the number of separate circuit components, drastically reduces the number of printed circuit board interconnects, and generally makes motor control much simpler to implement.

SUMMARY OF THE INVENTION

The present invention provides a single chip integrated circuit for motor control/drive for a three phase, permanent magnet DC Brushless Motor which includes a Boost Regulator DC-to-DC Converter to provide the gate drive voltage for external high side NMOS Power FETS. An integrated circuit with this configuration holds clear advantages over existing gate drive methods, which are the charge pump method and the bootstrap capacitors method.

The apparatus of the present invention includes a boost regulated DC-to--DC converter and gate drive circuits integrated on the same die with a micro-processor, along with high density digital logic functions, analog functions, etc. The gate drive circuits are used to drive external power FETs, particularly high side NMOS. The micro-processor may also be some type of micro-controller or digital signal processor (DSP). By being able to place these functions on a single integrated circuit, a motor or actuator control system can be placed on a single chip. With appropriate sensors to provide feedback to the integrated circuit, the present invention includes a system which is capable of executing actuator move functions, such as position, velocity, velocity profile, torque, etc., and sequencing these events as well.

A single integrated circuit which includes a micro-processor has the advantage of programmability and customization of control functions to different motors and/or applications. Including a DC-to-DC converter allows use of NMOS high side FETs by providing a voltage source from which to drive their gates. The fact that the DC-to-DC converter regulates the voltage source tends to make it more efficient. The high side gate voltage, $V_{GS}$, stays constant over a range of drain voltages without requiring another supply.

DESCRIPTION OF THE PREFERRED EMBODIMENT

Figure 1:
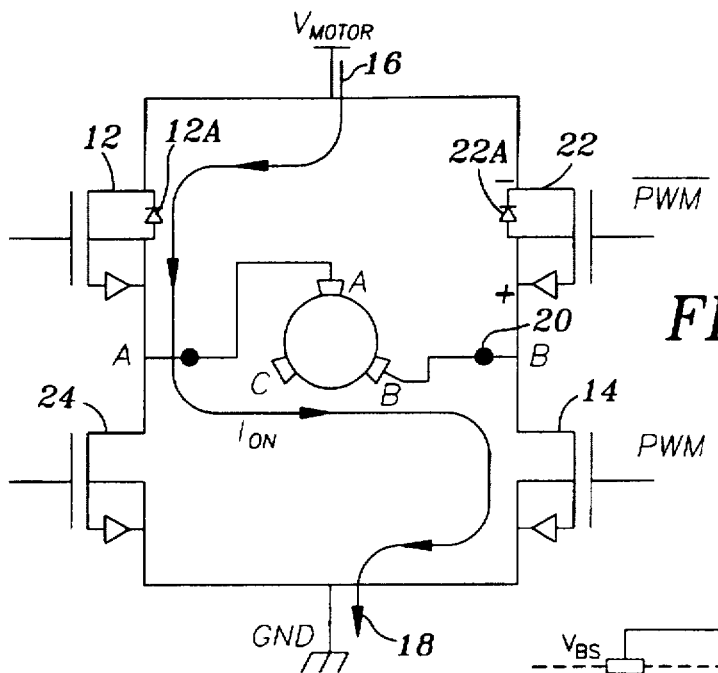
FIG. 1 is a circuit diagram illustrating two of the three Half-H drive stages required for 3-phase motors.

A boost regulated DC-to-DC converter for the purpose of providing high side gate drive voltage to external NMOS FETs has been achieved in earlier and less sophisticated processes than that used by the present invention.

Major differences between the prior art and the present invention is the available device structures which impact specific design aspects of a Boost Regulator. One of the major differences is that the power structure capable of switching an external inductor required by a boost converter is a bipolar NPN transistor in the prior art, while a lateral power NMOS, or LDMOS, is used in the present invention. An advantage of the implementation of the present invention is that substantially less operating current is required to switch the LDMOS, while the bipolar NPN in prior art requires base drive current. Reduction of current consumption and associated power dissipation produced by any function on an integrated circuit is always desirable, and this is the result of implementing the boost regulated DC-to-DC converter in the integrated circuit of the present invention.

Another important difference between prior art and the present invention is in the die area required to implement the same functions, particularly digital logic. Prior art devices contained a fairly small amount of digital logic by present day standards in mixed-signal designs, yet a large percentage of the area on the die was required for logic. Prior art circuits evolved from a bipolar process to include rather low performance, area inefficient digital logic which clearly is not beneficial to mixed signal designs with much digital content. Furthermore, the large CMOS structures of prior art devices produce slow switching speeds that limit performance at higher frequency. In comparison, the present invention evolved from a one micron CMOS process to include a small number of bipolar structures, higher voltage analog CMOS (forty volt $BV_{dss}$), and sixty volt LDMOS power structures. The sixty volt LDMOS transistor which will perform as a low-side switch to flux the inductor, then let it fly-back to a fairly high potential. Regulating the Boost voltage reference to $V_s$ allows the generation of high-side NMOS gate drive voltage over a wide range of $V_s$ voltage (with $V_B \leq 60$ V).

The present invention includes a single chip integrated circuit for motor control/drive for three phase permanent magnet DC Brushless Motor which includes a Boost Regulator DC-to-DC Converter to provide the gate drive voltage for external high-side MOS Power FETs. An integrated circuit with this configuration holds clear advantages over existing gate drive methods, which are the charge pump method and the bootstrap capacitors method.

Fully on die charge pumps are very inefficient in die area due to the need for fairly large value capacitors if external FETs are to be turned on quickly. Also, individual charge pumps are required for each high side external FET, three in the case of a three phase motor drive. With switching frequencies typically at the upper end of the audio range, twenty KHz for Pulse Width Modulation (PWM) speed and/or torque control, transition times are required to be shorter, typically less than one microsecond. This rules out the use of individual charge pumps due to the prohibitively large capacitors.

Partially on die charge pumps are an alternative, but still require either some on die capacitance or a number of external components and integrated circuit pins. They require switching frequencies around 1 MHz, and generally suffer from inefficiency due to parasitic capacitance losses. Also, inefficiency relates to the use of a clamp to limit the charge pump voltage.

Additionally, a three phase motor requires electronic commutation. With a three phase, four pole motor, twelve electrical commutation steps are required per rotor revolution. With motor revolutions per minute, RPMs, now exceeding ten thousand, commutation frequency is exceeding two thousand steps per second, as can be seen as follows:

$$f \text{ commutation} > \frac{10,000 \text{ RPM}}{60 \text{ sec/min}} \times 12 \text{ steps} > 2 \text{ KHz},$$

where previous permanent magnet Brush Motors driven by an H-Bridge require only three hundred hertz as a directional change frequency.

In addition to higher commutation frequencies, a new technique for reducing PD (power dissipation) in the drive FETs is to recirculate inductive motor winding current through a FET operating in inverse rather than through the drain to back-gate body diode. This technique is sometimes referred to as "synchronous rectification". Using this technique requires both low and high side FET's to switch at the PWM frequency.

FIG. 1 shows two of the three Half-H drive stages required for three phase motors for ease of discussion. In PWM, pulse width modulation, operation, consider FET 12 and FET 14 are turned on to complete the drive current path from terminal 16, having voltage $V_{motor}$, to terminal 18, ground, as shown by $I_{on}$. If FET 12 is left on, and FET 14 is turned off, the motor current due to inductance is maintained in the same direction, forcing node B to rise until FET 22, having drain to back gate diode 22A, forward biases. The forward voltage, $V_F$, of diode 22A can be several volts, and therefore can dissipate a substantial amount of power, which results in loss of the inductive energy.

By comparison, if FET 22 is turned on during the off time of FET 14, the inductive current of the motor will recirculate through FET 22 operating in inverse. Since the power FETs are generally chosen for low drain to source resistance when the transistor is on in the forward mode, or to have low IR drop, and low power dissipation, the same will hold true if operated in inverse. The IR or voltage drop will be less than the forward voltage, $V_F$, of the drain to back gate diode, resulting in a reduction in power loss during recirculation. This results in lower current ripple during pulse width modulation, PWM, and improved system efficiency. Use of this "synchronous rectification" technique requires the high side FETs, field effect transistors, to switch at the PWM frequency. At a typical PWM frequency of twenty KHz, this requires a high side gate drive voltage source to "replenish" the gate charge every fifty microseconds. For systems driving forty amp motors with a motor voltage, $V_{motor}$, equal to twelve to thirty-six volts, power FETs commonly used require fifty to one hundred nano-coulombs to transition the transistor on. To transition a field effect transistor with one hundred nano-coulombs gate charge within one microsecond requires:

$$I_{GATE} > \frac{100 \text{ nC}}{1 \text{ nS}} = 100 \text{ mA.1}$$

This high instantaneous current requires a fairly high value storage capacitor on the gate drive voltage source to prevent droop in the voltage during FET turn on. To prevent no more than a one hundred millivolt drop:

$$C = I \frac{dt}{dU} = \frac{100 \text{ mA} \times 1 \text{ μS}}{.1 U} = 1 \text{ μF}$$

Time averaged current draw from a high side gate drive voltage source is in the range of 10 mA. Use of a charge pump is just not practical.

Figure 2:
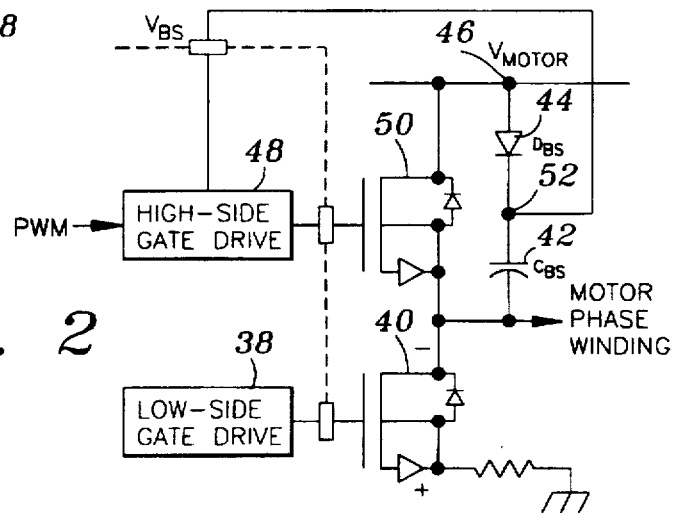
FIG. 2 is a circuit diagram illustrating a typical bootstrap topology.

FIG. 2 is a circuit diagram illustrating a typical bootstrap topology. The disadvantages of this scheme are discussed as follows.

First, a disadvantage lies in the fact that an additional pin is needed for each high side gate drive, or three pins for a three phase motor application. Second, a disadvantage exists in the fact that an external diode and a capacitor are needed for each high side gate drive. Third, the bootstrap capacitor must be replenished at periodic intervals, forcing pulse width modulation control to be switched from the high side. Fourth, the high side drive cannot be held on indefinitely in its steady state with any current drawn from a bootstrap pin. This is the reason capacitor refresh is required, as stated in the third disadvantage. Fifth, pulse width modulation from the high side forces motor inductive current recirculation through the low side field effect transistors. This allows the phase connection to go negative, beneath ground which can complicate design of any current sensing resistor in series with the common sources of low side field effect transistors to ground. Sixth, there is a disadvantage in the dynamic impact in the bootstrap voltage, $V_{BS}$, moving during FET transition.

Referring now to the components of FIG. 2, a bootstrap circuit for use in motor control applications is illustrated. In operation of the bootstrap circuit, low side gate drive 38 and low side FET 40 is turned on and the bottom plate of bootstrap capacitor 42, $C_{BS}$, is connected to essentially ground. That forward biases the bootstrap diode 44, $D_{BS}$, from $V_{MOTOR}$ 46 and bootstrap capacitor 42 charges to a voltage that is equal to the voltage at node 46, $V_{MOTOR}$, minus the forward diode drop of diode 44. When the high-side drive is turned on, the low side gate drive 38 is turned off and then the high side gate drive 48 is turned on. As $V_{GS}$ of the high side NMOS device 50, the one whose drain is tied to node 46, $V_{motor}$, starts to increase, FET 50 starts to turn on. It pulls up the motor phase winding and also pushes up the bottom of the bootstrap capacitor 42 and thus forces the voltage at node 52, $V_{BS}$, to rise above $V_{MOTOR}$, node 46, reverse biasing diode 44. Voltage $V_{BS}$ at node 52 thus rises to approximately $V_{MOTOR}$ plus the voltage stored across capacitor 44. This is adequate provided high side gate drive 48 is periodically turned off and low side gate drive 38 is turned back on to replenish or refresh bootstrap cap 42. A problem occurs if for some reason the system requires that high side gate drive 48 turn on for an extended length of time that approaches DC. Should pin 52, $V_{BS}$, or the circuitry connected to it have current draw, it will pull charge off bootstrap capacitor 42 and the voltage will fall. Thus, one major drawback in using a bootstrap technique is that it can not operate in a DC fashion. It requires that it be replenished.

In light of the foregoing disadvantages of the charge pump method and the bootstrap capacitors method, several advantages to using a boost regulator become apparent.

First, no on die capacitors are required when using a boost regulator. Second, the method of the present invention supports higher time averaged current capability. Third, the method of the present invention requires two pins instead of three pins for bootstrap solution for three phase motor drive. Fourth, the method of the present invention regulates voltage referenced to $V_{drain}$ of high side FETs, which is more energy efficient since clamping is not needed. Fifth, the present invention uses fewer external components than the bootstrap method, that is three instead of six. Sixth, the method of the present invention supports DC drive to the high side. In other words, no refresh for the capacitor is required. Seventh, there is no dynamic effect from the supply moving during FET transition, which is a bootstrap technique problem. The boost voltage, $V_{boost}$ is a static voltage source.

Figure 3:
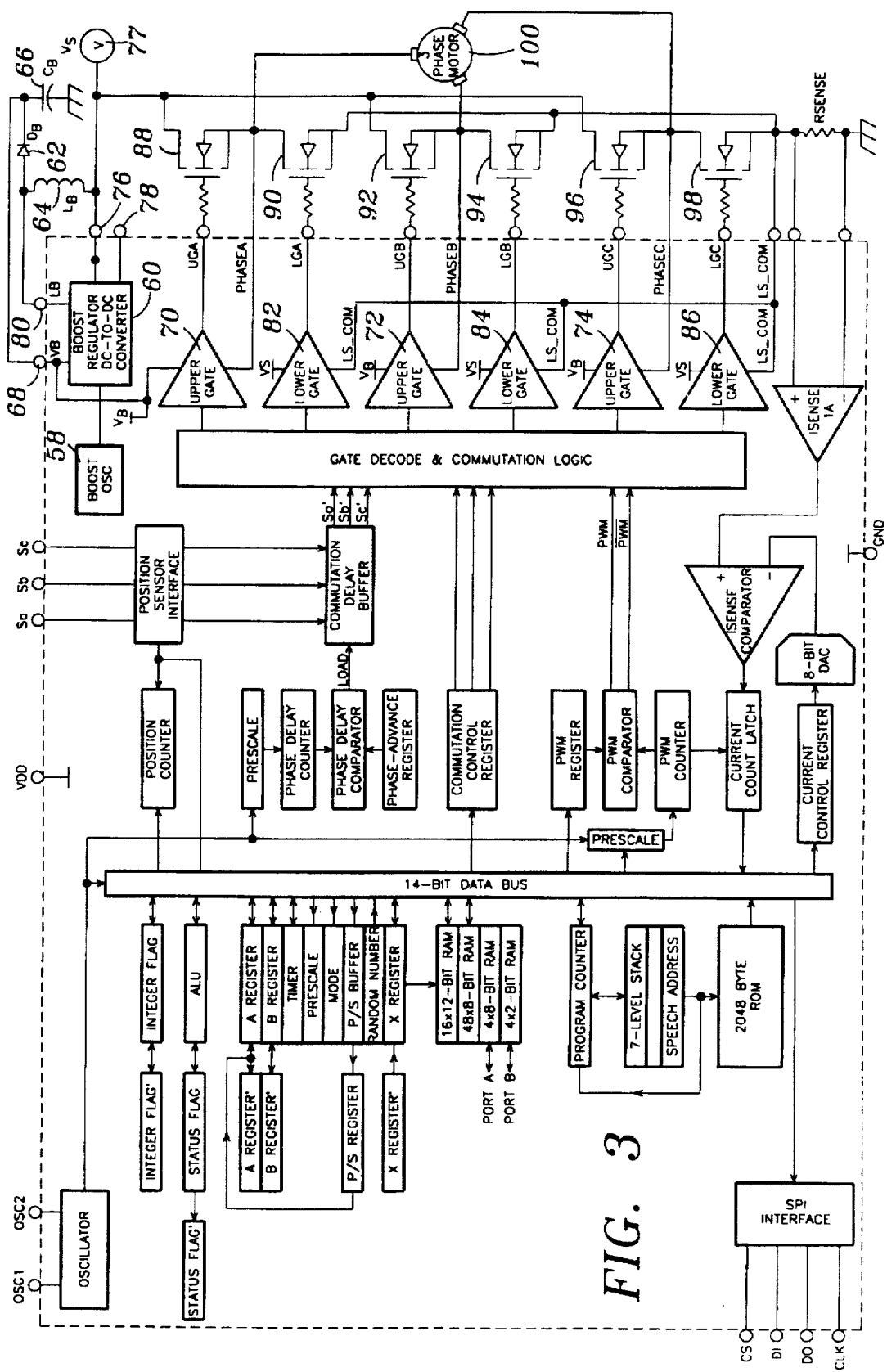
FIG. 3 is a circuit diagram illustrating a motor control integrated circuit with a boost regulated DC to DC converter on-die, with control logic and a micro-processor.

FIG. 3 is a block diagram that illustrates the inclusion of a micro-controller on the same die with a boost regulator and three sets of upper and lower gate drives. The gate drives are driving three half H external power FETs which in turn drive a three phase brushless motor.

This is the reason one would implement the converter, which is contained in the upper right corner of the diagram and includes the blocks labeled boost osc 58 and boost regulator 60, and external components diode 62, $D_B$, inductor 64, $L_B$ and capacitor 66, $C_B$. The boost voltage at pin 68, $VB_B$, is fed back to the integrated circuit to provide feedback to the voltage regulation circuitry contained in boost regulator 60, and to provide the voltage source connection to upper gate drives 70, 72 and 74.

In the preferred embodiment, boost regulator 60 requiring boost oscillator 58 is illustrated. In this embodiment a boost regulator 60 with four pins 76, a common supply pin and 78, a command and pin, and with external component pins, $V_B$ at pin 68 and LB at pin 64 as the two additional pins required. The external components, diode 62, inductor 64, and capacitor 66, represent the Boost Diode, the Boost Inductor and the Boost Capacitor. The whole point though, of generating this booster is so $V_B$, the voltage on pin 68 or the $V_B$ pin is a regulated voltage above $V_M$ or $V_{Motor}$ or $V_{Supply}$. Also, there is an upper gate drive and a lower gate drive in three sets. These gate drives upper gate 70 and lower gate 82 for phase A, similarly, upper gate 72 and lower gate 84 for phase B and upper gate 74 and lower gate 86 for phase C. Those are the upper and lower gate drives for field effect transistors 88, 90, 92, 94, 96 and 98, type IRFD 54 in the preferred embodiment, being used to form the half H topology to drive three phase brushless motor 100. Upper gate drives 70, 72 and 74 connect internally to pin 68, $V_B$, and the voltage of $V_B$ has been boosted a regulated amount above the motor voltage. When upper gate drives 70, 72 and 74 are turned on, the gate of external FETs 88, 92 and 96 will be driven to some voltage that is sufficiently above its drain to turn on FETs 88, 92 and 96 fully such that it's dissipating the minimal amount of power.

The remainder of the components illustrated in FIG. 3 are all labeled and are common to motor drive integrated circuits or motor interface drive integrated circuits and are well known to those skilled in the art.

Figure 4:
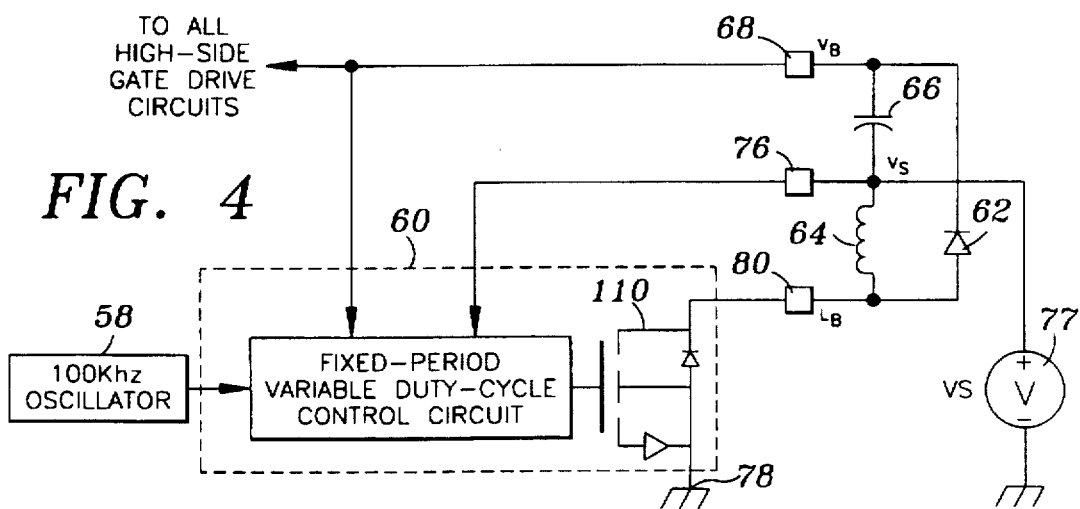
FIG. 4 is a circuit diagram illustrating a typical boost regulated DC-to-DC converter that may be used in the integrated circuit of FIG. 3.

FIG. 4 illustrates the essential blocks representing components to implement converter 60. A switch 110, shown as a common source NMOS device, can either connect or disconnect one end of inductor to ground. The basic operation of converter 60 is to switch a voltage, $V_s$, at pin 76, across the inductor 64 for an adequate length of time to allow current to increase and build a magnetic field, flux inductor 64, then switch 110 is opened. Since an inductor resists a change in current, instantaneous turn off of the NMOS switch 110 causes the magnetic field in inductor 64 to collapse, which produces a fly back phenomena. The other end of inductor 64 is connected to $V_s$ at pin 76. The voltage at the NMOS switch 110 end of inductor 64 will fly positive with respect to $V_s$ at pin 76 until it reaches a high enough potential to forward bias diode 62. Once current can flow in diode 62, the energy stored as magnetic flux in inductor 64 is converted to current charging capacitor 66, converting it back to a voltage. During each cycle of switch 110, inductor 64 is fluxed during the time switch 110 is closed, then de-fluxes during the time switch 110 is opened. Each cycle, therefore, increases the voltage across capacitor 66, and the absolute voltage at pin 68, $V_B$.

Once $V_B$ reaches some potential with respect to $V_s$, the ratio of the time switch 110 is closed to the time it is opened can be decreased. In other words, switch 110 on time duty cycle can be reduced. This lowers the energy stored in inductor 64 during switch 110 on time such that when transferred to capacitor 66 during switch 110 off time the voltage at pin 68, $V_B$, will not rise as much. The voltage at pin 68 can thus be regulated by modifying the duty cycle of switch 110 until the energy transferred is only enough to replace whatever is supplied from capacitor 66 to upper gate drive circuits 70, 72 and 74.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

I claim:

1. A single integrated circuit used as a control system for a motor comprising:
   a circuit positioned on the single integrated circuit for operating motor controls of the motor;
   a gate drive positioned on the single integrated circuit for controlling external power transistors to the single integrated circuit connected to the motor;
   a boost regulated converter for providing a voltage source to said gate drive means positioned on the single integrated circuit; and
   a microprocessor positioned on the single integrated circuit and for operating said circuit, said gate drive and said boost regulated converter.

2. The integrated circuit according to claim 1, wherein said microprocessor includes a micro-controller.

3. The integrated circuit according to claim 1, wherein said microprocessor includes a digital signal processor.

4. The integrated circuit according to claim 1, wherein said boost regulated converter includes a boost regulated DC to DC converter.

5. The integrated circuit according to claim 1, wherein said boost regulated DC to DC converter includes a lateral power NMOS, or LDMOS.

6. A single integrated circuit used as a control system for a motor including:
   motor control circuits positioned on the single integrated circuit, gate drives positioned on the single integrated circuit and for controlling external power transistors to the single integrated circuit, a boost regulated converter for providing a voltage source to said gate drives positioned on the single integrated circuit, and a microprocessor positioned on the single integrated circuit for operating said motor control circuits, said gate drives and said boost regulated converter.

7. A single integrated circuit used as a control system for a motor comprising:

a circuit for operating motor controls positioned on the single integrated circuit;

a gate drive positioned on the single integrated circuit for controlling external power transistors to the single integrated circuit connected to the motor including circuits to control external NMOS power FET's;

a boost regulated DC to DC converter for providing a voltage source to said gate drive positioned on the single integrated circuit, said converter means including a lateral power NMOS, or LDMOS; and a microprocessor positioned on the single integrated circuit for operating said circuit, said gate drive and said boost regulated converter.

8. The integrated circuit according to claim 7, wherein said microprocessor includes a micro-controller.

9. The integrated circuit according to claim 7, wherein said microprocessor includes a digital signal processor.

10. A single integrated circuit used as a control system for a motor comprising:

a circuit positioned on the single integrated circuit for operating motor controls of the motor;

a gate drive positioned on the single integrated circuit for controlling external power transistors to the single integrated circuit connected to the motor;

a boost regulated converter for providing a voltage source to said gate drive positioned on the single integrated circuit, said voltage source being referenced to $V_{drain}$ of said gate drive; and a microprocessor positioned on the single integrated circuit and for operating said circuit, said gate drive and said boost regulated converter.

* * * * *